(12) United States Patent
Yokogawa

(10) Patent No.: US 10,411,053 B2
(45) Date of Patent: Sep. 10, 2019

(54) SOLID STATE IMAGING ELEMENT AND ELECTRONIC DEVICE TO OBTAIN HIGH SENSITIVITY OF LIGHT ON A LONG WAVELENGTH SIDE

(71) Applicant: SONY CORPORATION, Tokyo (JP)

(72) Inventor: Sozo Yokogawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/312,069

(22) PCT Filed: May 29, 2015

(86) PCT No.: PCT/JP2015/065534
§ 371 (c)(1),
(2) Date: Nov. 17, 2016

(87) PCT Pub. No.: WO2015/190318
PCT Pub. Date: Dec. 17, 2015

(65) Prior Publication Data
US 2017/0110493 A1     Apr. 20, 2017

(30) Foreign Application Priority Data
Jun. 11, 2014   (JP) .................................. 2014-120205

(51) Int. Cl.
*H01L 31/028* (2006.01)
*H01L 31/0376* (2006.01)
*H01L 27/146* (2006.01)

(52) U.S. Cl.
CPC ........ *H01L 27/1461* (2013.01); *H01L 27/146* (2013.01); *H01L 27/1463* (2013.01);
(Continued)

(58) Field of Classification Search
CPC ............ H01L 31/0216; H01L 31/0232; H01L 31/054; H01L 31/1013; H01L 31/028;
(Continued)

(56) References Cited

U.S. PATENT DOCUMENTS 6,147,732 A * 11/2000 Aoyama .............. G02B 5/3083
349/112
8,711,263 B2 * 4/2014 Nishikido ......... H01L 27/14625
257/437
(Continued)

FOREIGN PATENT DOCUMENTS

JP   2006-216841 A   8/2006
JP   2006-261372 A   9/2006
(Continued)

OTHER PUBLICATIONS

Official Action (no English translation available) for Japanese Patent Application No. 2017-253205, dated Oct. 18, 2018, 8 pages.
(Continued)

*Primary Examiner* — Julia Slutsker
(74) *Attorney, Agent, or Firm* — Sheridan Ross P.C.

(57) ABSTRACT

The present disclosure relates to a solid state imaging element and an electronic device that make it possible to improve sensitivity to light on a long wavelength side. A solid state imaging element according to a first aspect of the present disclosure has a solid state imaging element in which a large number of pixels are arranged vertically and horizontally, the solid state imaging element includes a periodic concave-convex pattern on a light receiving surface and an opposite surface to the light receiving surface of a light absorbing layer as a light detecting element. The present disclosure can be applied to, for example, a CMOS and the
(Continued)

like installed in a sensor that needs a high sensitivity to light belonging to a region on the long wavelength side, such as light in the infrared region.

17 Claims, 20 Drawing Sheets

(52) U.S. Cl.
CPC .. *H01L 27/14629* (2013.01); *H01L 27/14636* (2013.01); *H01L 27/14649* (2013.01); *H01L 31/028* (2013.01); *H01L 31/03762* (2013.01); *H04N 2209/047* (2013.01)

(58) Field of Classification Search
CPC .......... H01L 31/03762; H01L 27/1461; H01L 27/14629; H01L 27/1463; H01L 27/14636; H01L 27/14649; H01L 27/146
USPC ................................. 257/432, 440
See application file for complete search history.

(56) References Cited

U.S. PATENT DOCUMENTS

| | | | | |
|---|---|---|---|---|
| 2005/0040440 | A1* | 2/2005 | Murakami | H01L 27/1462 257/225 |
| 2011/0222145 | A1* | 9/2011 | Ito | G02B 5/208 359/359 |
| 2012/0153416 | A1* | 6/2012 | Tanaka | H01L 31/02168 257/431 |
| 2013/0075849 | A1* | 3/2013 | Suzuki | H01L 27/14605 257/432 |
| 2014/0184810 | A1* | 7/2014 | Sekiguchi | H01L 27/1461 348/164 |
| 2015/0268394 | A1* | 9/2015 | Uchiyama | G02B 1/115 359/653 |

FOREIGN PATENT DOCUMENTS

| | | |
|---|---|---|
| JP | 2007-165696 A | 6/2007 |
| JP | 2009-088030 A | 4/2009 |
| JP | 2012-142568 A | 7/2012 |
| JP | 2012-169530 | 9/2012 |
| JP | 2013-033864 A | 2/2013 |
| JP | 2016-001633 | 1/2016 |
| WO | 2010/110317 A1 | 9/2010 |

OTHER PUBLICATIONS

Official Action (with English translation) for Chinese Patent Application No. 201580029430.9, dated Dec. 3, 2018, 14 pages.
Official Action (no English translation available) for Japanese Patent Application No. 2017-253205, dated Jun. 4, 2019, 4 pages.

* cited by examiner

SOLID STATE IMAGING ELEMENT AND ELECTRONIC DEVICE TO OBTAIN HIGH SENSITIVITY OF LIGHT ON A LONG WAVELENGTH SIDE

CROSS REFERENCE TO RELATED APPLICATIONS

This application is a U.S. National Phase of International Patent Application No. PCT/JP2015/065534 filed on May 29, 2015, which claims priority benefit of Japanese Patent Application No. JP 2014-120205 filed in the Japan Patent Office on Jun. 11, 2014. Each of the above-referenced applications is hereby incorporated herein by reference in its entirety.

TECHNICAL FIELD

The present disclosure relates to a solid state imaging element and an electronic device, and relates particularly to a solid state imaging element and an electronic device in which the light receiving sensitivity to light on the long wavelength side such as the infrared region is improved.

BACKGROUND ART

Thus far, a CMOS solid state imaging element and a CCD have been known as two-dimensional solid state imaging elements, and single-crystal silicon (Si) is generally used for the light absorbing layer of the light detecting element of them that performs photoelectric conversion.

Si is an indirect transition semiconductor and has a band gap of 1.1 eV, and therefore has sensitivity to visible light wavelengths to near-infrared wavelengths of approximately 1.1 um (micrometers). However, due to the wavelength dependence of the light absorption coefficient, the light absorption efficiency per unit thickness becomes smaller as the wavelength becomes longer.

For example, in the case of a solid state imaging element in which the thickness of the Si layer as the light absorbing layer is 3 um, the light absorption efficiency at a wavelength of 650 nm is approximately 60 to 70%, whereas, at a wavelength of 900 nm, the light absorption efficiency is only approximately 10 to 20% and most photons are transmitted through the Si layer. Hence, when it is attempted to obtain a solid state imaging element having a high sensitivity to light in the red to infrared region, increasing the thickness of the Si layer is known as an effective method.

However, increasing the thickness of the Si layer has a high degree of manufacturing difficulty, such as the need to perform high energy implantation in order to obtain a desired impurity profile, and furthermore directly leads to an increase in material cost. In addition, the ratio of the thickness to the pixel size of the solid state imaging element is increased, and an increase in the amount of color mixing components of the Si bulk in the Si layer etc. are caused; thus, this is a factor in the degradation of image quality. Moreover, an increase in the amount of defects in the crystal etc. due to the increase in the thickness of the Si layer are factors in the degradation of pixel characteristics, such as an increase in dark current and white spots.

In this regard, as a method for obtaining a high sensitivity to light on the long wavelength side without increasing the thickness of the Si layer, a structure in which the loss of light caused by an etalon phenomenon based on the interference of light is suppressed by forming a fine, random concave-convex structure on the surface on the opposite side to the light receiving surface of the pixel of the solid state imaging element is proposed (e.g. see Patent Literature 1).

CITATION LIST

Patent Literature

Patent Literature 1: WO 2010/110317 A1

SUMMARY OF INVENTION

Technical Problem

In the method of Patent Literature 1, when it is used for a back-side illumination solid state imaging element, a concave-convex structure is patterned on the same surface as the surface on which a pixel transistor that transfers a charge detected in the solid state imaging element etc. are arranged, and consequently there are harmful effects such as an increase in the amount of defects in crystal planes and an increase in dark current.

Furthermore, the effect of suppressing the reflected light at the light receiving surface is low, and the effect of suppressing the re-release, from the light receiving surface, of the light components reflected at the surface on the opposite side to the light receiving surface is low.

The present disclosure has been made in view of such circumstances, and improves the sensitivity to light on the long wavelength side of the solid state imaging element without increasing the thickness of the Si layer that is the light absorbing layer.

Solution to Problem

A solid state imaging element according to an aspect of the present disclosure has a large number of pixels are arranged vertically and horizontally, the solid state imaging element includes a periodic concave-convex pattern on a light receiving surface and an opposite surface to the light receiving surface of a light absorbing layer as a light detecting element.

The light absorbing layer may be made of single-crystal Si.

The concave-convex pattern may be formed at least on the light receiving surface and the opposite surface to the light receiving surface of the light absorbing layer corresponding to a pixel for IR detection out of the large number of pixels.

A period of the concave-convex pattern formed on the opposite surface to the light receiving surface of the light absorbing layer may be infinitely small.

A period of the concave-convex pattern formed on the light receiving surface and the opposite surface to the light receiving surface of the light absorbing layer may vary in accordance with a wavelength to be sensed.

The concave-convex pattern may be formed one-dimensionally periodically or two-dimensionally periodically.

A crystal plane of the light receiving surface and the opposite surface to the light receiving surface of the light absorbing layer on which the concave-convex pattern is formed may be a (100) plane, and a crystal plane of a wall surface of the concave-convex pattern may be a (111) plane.

A period of the concave-convex pattern may be 1 um or less.

An element isolation structure may be formed at a boundary with an adjacent pixel of the light absorbing layer.

The element isolation structure may be made of a material having a refractive index lower than a refractive index of the light absorbing layer.

A metal reflecting wall may be formed in the element isolation structure.

The solid state imaging element according to the first aspect of the present disclosure may further include a reflecting mirror structure on a lower side of the light absorbing layer.

An interconnection layer may also serve as the reflecting mirror structure.

An electronic device according to a second aspect of the present disclosure is equipped with a solid state imaging element in which a large number of pixels are arranged vertically and horizontally. The solid state imaging element has a periodic concave-convex pattern on a light receiving surface and an opposite surface to the light receiving surface of a light absorbing layer as a light detecting element.

In the first and second aspects of the present disclosure, the light that has entered the light absorbing layer as the light detecting element is likely to be internally reflected due to the periodic concave-convex pattern formed on the light receiving surface and the opposite surface to the light receiving surface, and thereby the effective optical path length of the light absorbing layer is increased; thus, light can be absorbed with good efficiency.

Advantageous Effects of Invention

According to the first and second aspects of the present disclosure, reflection can be suppressed with good efficiency in the visible light wavelength range to the electromagnetic wave range up to near-infrared light, and furthermore the sensitivity of light absorption to light on the long wavelength side can be improved.

DESCRIPTION OF EMBODIMENT(S)

Hereinbelow, preferred embodiments of the present disclosure (hereinafter, referred to as embodiments) are described in detail with reference to the drawings.

<Example of the Configuration of the Solid State Imaging Element>

Figure 1:
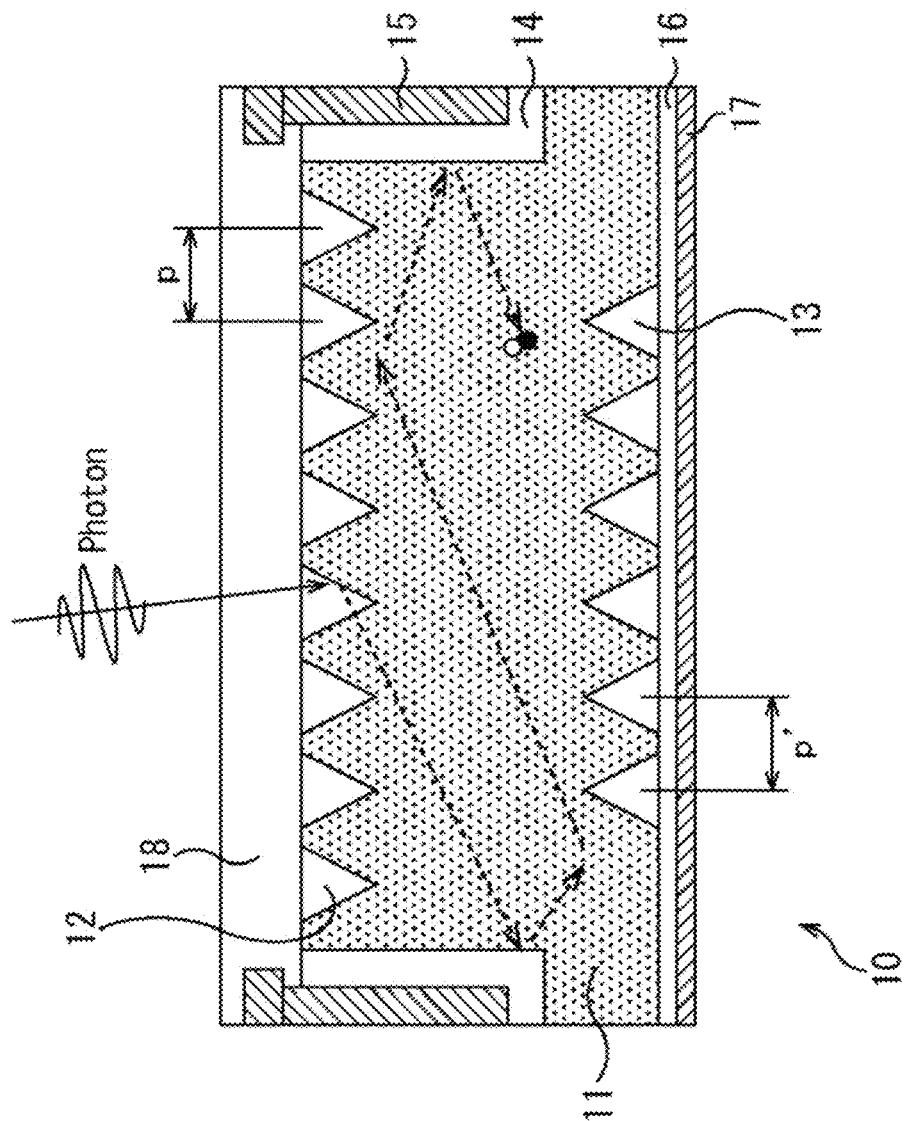
FIG. 1 is a cross-sectional view showing an example of the configuration of a solid state imaging element to which the present disclosure is applied.

FIG. 1 is a cross-sectional view showing an example of the configuration of a back-side illumination solid state imaging element 10 that is an embodiment of the present disclosure.

The upper side of the drawing is the light receiving surface (the back surface), and the illustration of a color filter, an on-chip lens, etc. to be arranged on the upper side of the light receiving surface is omitted. In the drawing, an example of the configuration of one pixel is shown; in a two-dimensional solid state imaging element formed of the back-side illumination solid state imaging element 10, X×Y (X and Y being an integer) adjacent pixels are formed on one chip, N×M (N<X, M<Y; e.g. 2×2) adjacent pixels constitute one unit, and each pixel of one unit is configured to detect light (an electromagnetic wave) of the wavelength of any of R, G, B, and IR. This similarly applies to the subsequent drawings.

In the configuration example of FIG. 1, a periodic (period: P), fine concave-convex pattern 12 is formed on the light receiving surface (the surface on the upper side of the drawing) of a Si layer 11 that is the light absorbing layer. Similarly, a periodic (period: P'), fine concave-convex pattern 13 is formed on the surface (the lower side in the drawing) on the opposite side to the light receiving surface. The concave-convex pattern 12 can act as a good-quality anti-reflection film having a low reflectance for light in a wide range from the entire visible light wavelength range to the infrared wavelength range. Furthermore, by using a periodic structure, the increase in the surface area of Si can be kept finite. Thereby, dark current, random noise, the increase in the amount of white spots, etc. due to crystal defects of the semiconductor crystal can be suppressed. The configuration, size, etc. of the concave-convex patterns 12 and 13 are described later.

In the configuration example of FIG. 1, an element isolation structure 14 filled with a dielectric material (SiO$_2$ or the like) having a relatively low refractive index to Si is formed at the boundary with an adjacent pixel, that is, on the lateral side in the drawing of the Si layer 11. In the case of FIG. 1, the element isolation structure 14 is in a prism shape, and is formed by etching from the light receiving surface side. A metal reflecting wall 15 is placed in the element isolation structure 14.

On the lower side of the Si layer 11, a reflecting mirror structure 17 made of Al, Cu, Ag, or an alloy of them is formed via an insulating film 16. As the reflecting mirror structure 17, instead of forming a dedicated film or layer for the purpose of the reflection of incident light, various interconnection layers provided on the lower side of the Si layer 11 may be made to have a function as the reflecting mirror structure 17. On the upper side of the Si layer 11 on which the concave-convex pattern 12 is formed, a flattening film 18 made of SiO$_2$, SiN, or the like is formed.

As described above, in the case of the configuration example shown in FIG. 1, the concave-convex patterns 12 and 13 are formed on the light receiving surface and the opposite surface to the light receiving surface of the Si layer 11, respectively. Further, the element isolation structure 14 is formed at the boundary with an adjacent pixel, and the reflecting mirror structure 17 is formed on the lower side of the Si layer 11. Thereby, incident light is likely to repeat reflection in the Si layer 11, and the transmission of light from the Si layer 11 is suppressed; therefore, the light absorption efficiency in the Si layer 11 can be improved. That is, the sensitivity to incident light can be increased. Furthermore, color mixing derived from an adjacent pixel is suppressed by the element isolation structure 14 and the metal reflecting wall 15.

Modification Example 1 of the Solid State Imaging Element

Figure 2:
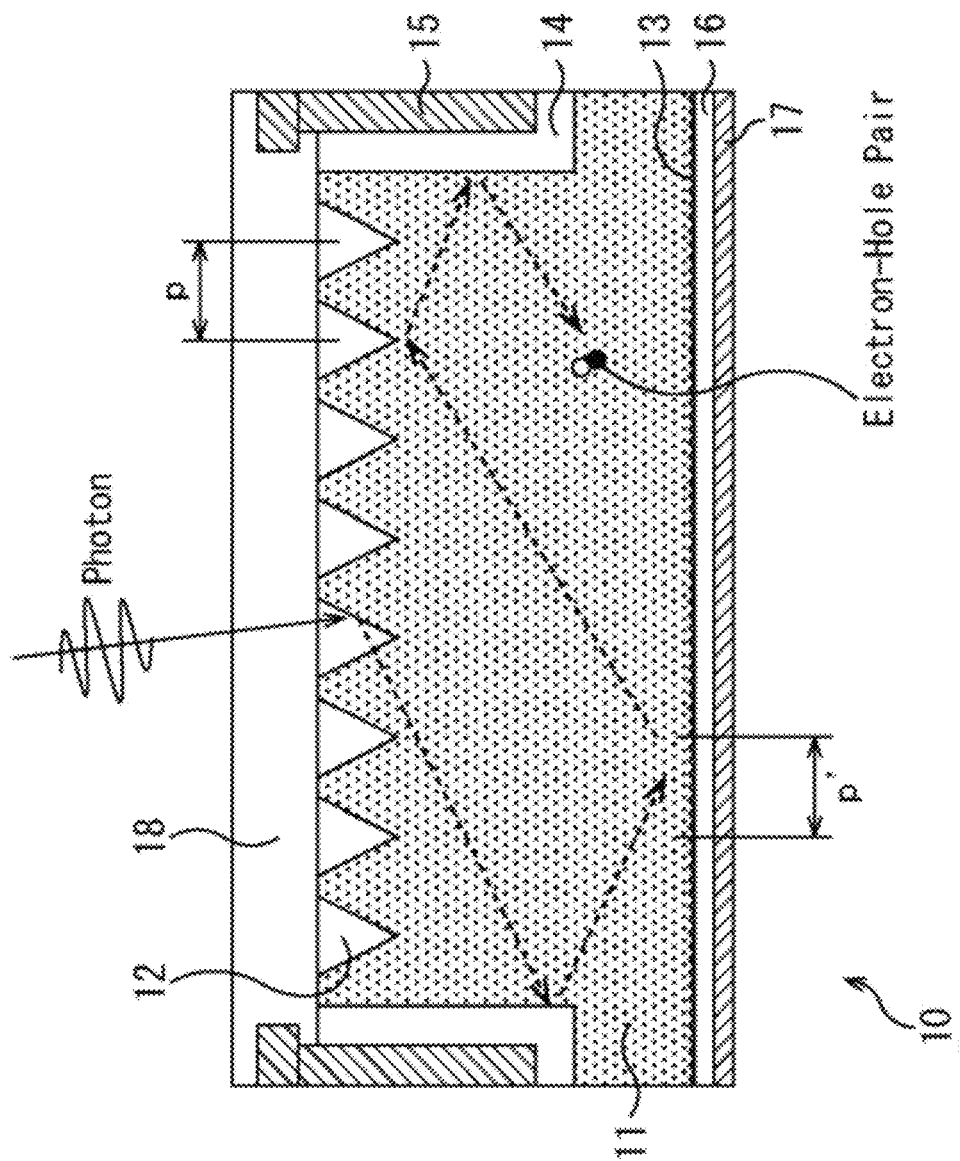
FIG. 2 is a cross-sectional view showing Modification Example 1 of the solid state imaging element to which the present disclosure is applied.

FIG. 2 is a cross-sectional view showing another example (Modification Example 1) of the configuration of the solid state imaging element 10 that is an embodiment of the present disclosure. Components in common with the configuration example shown in FIG. 1 are marked with the same reference numerals, and a description thereof is omitted as appropriate.

In Modification Example 1 shown in FIG. 2, the period of the concave-convex pattern 13 formed on the surface on the lower side of the Si layer 11 is altered to an infinitely small period.

In the case of Modification Example 1, the concave-convex patterns 12 and 13 are formed on the light receiving surface and the opposite surface to the light receiving surface of the Si layer 11, respectively. Further, the element isolation structure 14 is formed at the boundary with an adjacent pixel, and the reflecting mirror structure 17 is formed on the lower side of the Si layer 11. Thereby, incident light is likely to repeat reflection in the Si layer 11, and the transmission of light from the Si layer 11 is suppressed; therefore, the light absorption efficiency in the Si layer 11 can be improved. That is, the sensitivity to incident light can be increased. Furthermore, color mixing derived from an adjacent pixel is suppressed by the element isolation structure 14 and the metal reflecting wall 15.

Modification Example 2 of the Solid State Imaging Element

Figure 3:
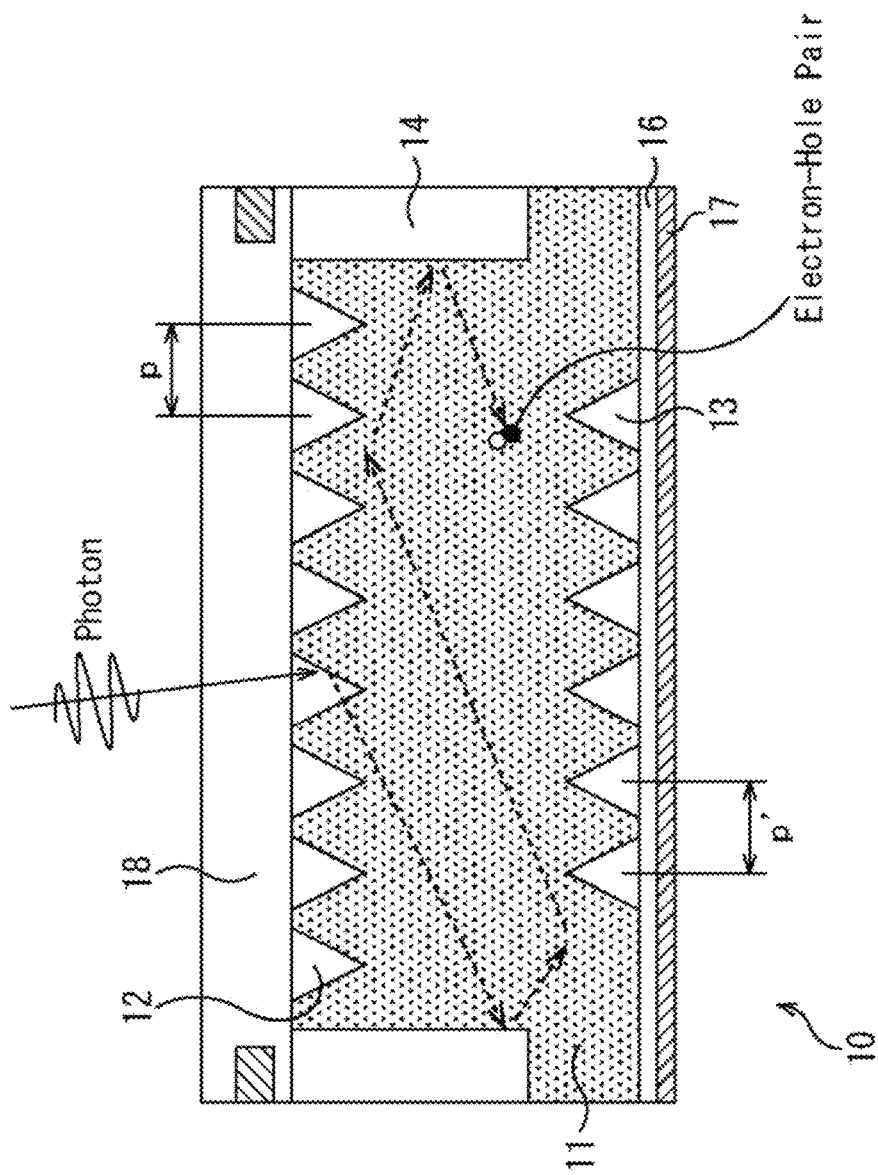
FIG. 3 is a cross-sectional view showing Modification Example 2 of the solid state imaging element to which the present disclosure is applied.

FIG. 3 is a cross-sectional view showing yet another example (Modification Example 2) of the configuration of the solid state imaging element 10 that is an embodiment of the present disclosure. Components in common with the configuration example shown in FIG. 1 are marked with the same reference numerals, and a description thereof is omitted as appropriate.

In Modification Example 2 shown in FIG. 3, the metal reflecting wall 15 is omitted from the configuration example shown in FIG. 1.

In the case of Modification Example 2, the concave-convex patterns 12 and 13 are formed on the light receiving surface and the opposite surface to the light receiving surface of the Si layer 11, respectively. Further, the element isolation structure 14 is formed at the boundary with an adjacent pixel, and the reflecting mirror structure 17 is formed on the lower side of the Si layer 11. Thereby, incident light is likely to repeat reflection in the Si layer 11, and the transmission of light from the Si layer 11 is suppressed; therefore, the light absorption efficiency in the Si layer 11 can be improved. That is, the sensitivity to incident light can be increased.

Modification Example 3 of the Solid State Imaging Element

Figure 4:
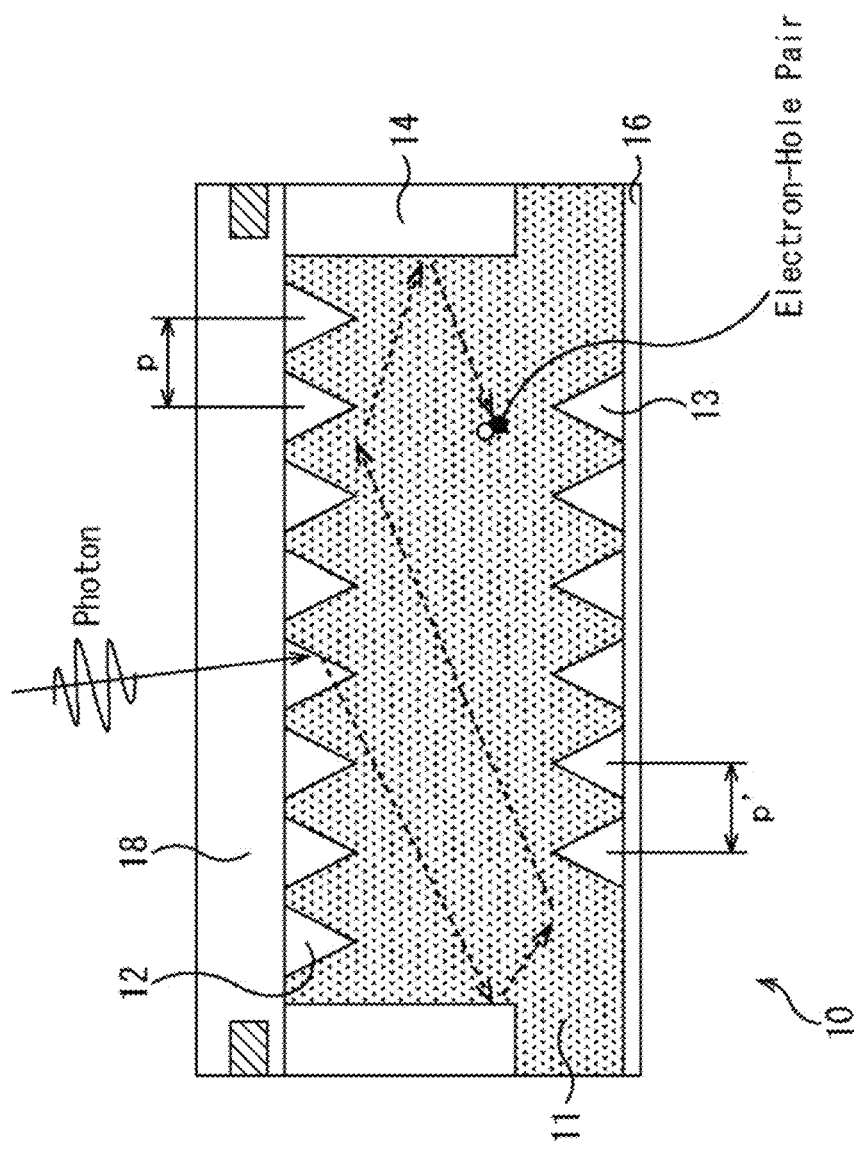
FIG. 4 is a cross-sectional view showing Modification Example 3 of the solid state imaging element to which the present disclosure is applied.

FIG. 4 is a cross-sectional view showing yet another example (Modification Example 3) of the configuration of the solid state imaging element 10 that is an embodiment of the present disclosure. Components in common with the configuration example shown in FIG. 1 are marked with the same reference numerals, and a description thereof is omitted as appropriate.

In Modification Example 3 shown in FIG. 4, the metal reflecting wall 15 and the reflecting mirror structure 17 are omitted from the configuration example shown in FIG. 1.

In the case of Modification Example 3, the concave-convex patterns 12 and 13 are formed on the light receiving surface and the opposite surface to the light receiving surface of the Si layer 11, respectively. Further, the element isolation structure 14 is provided at the boundary with an adjacent pixel. Thereby, incident light is likely to repeat reflection in the Si layer 11, and the transmission of light from the Si layer 11 is suppressed; therefore, the light absorption efficiency in the Si layer 11 can be improved. That is, the sensitivity to incident light can be increased.

Modification Example 4 of the Solid State Imaging Element

Figure 5:
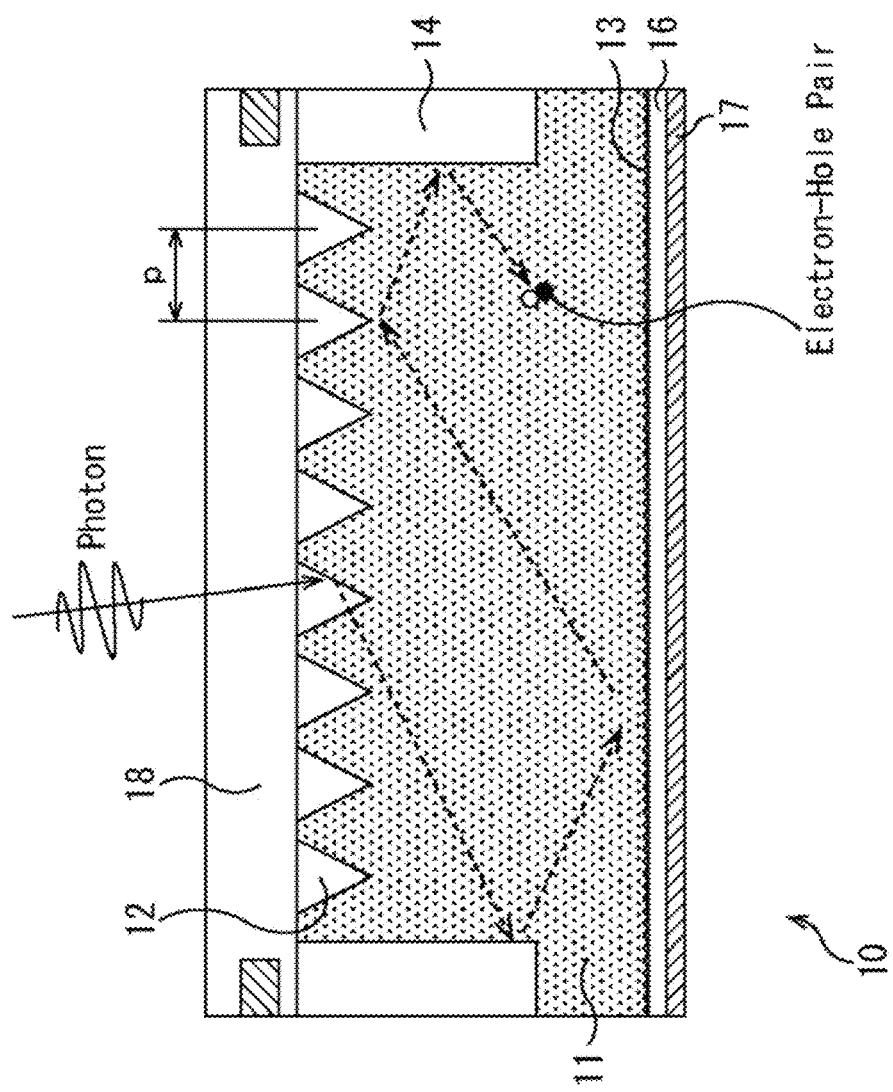
FIG. 5 is a cross-sectional view showing Modification Example 4 of the solid state imaging element to which the present disclosure is applied.

FIG. 5 is a cross-sectional view showing yet another example (Modification Example 4) of the configuration of the solid state imaging element 10 that is an embodiment of the present disclosure. Components in common with the configuration example shown in FIG. 1 are marked with the same reference numerals, and a description thereof is omitted as appropriate.

In Modification Example 4 shown in FIG. 5, the period of the concave-convex pattern 13 in the configuration example shown in FIG. 1 is altered to an infinitely small period, and the metal reflecting wall 15 is omitted.

In the case of Modification Example 4, the concave-convex patterns 12 and 13 are formed on the light receiving surface and the opposite surface to the light receiving surface of the Si layer 11, respectively. Further, the element isolation structure 14 is provided at the boundary with an adjacent pixel. Thereby, incident light is likely to repeat reflection in the Si layer 11, and the transmission of light from the Si layer 11 is suppressed; therefore, the light absorption efficiency in the Si layer 11 can be improved. That is, the sensitivity to incident light can be increased.

Modification Example 5 of the Solid State Imaging Element

Figure 6:
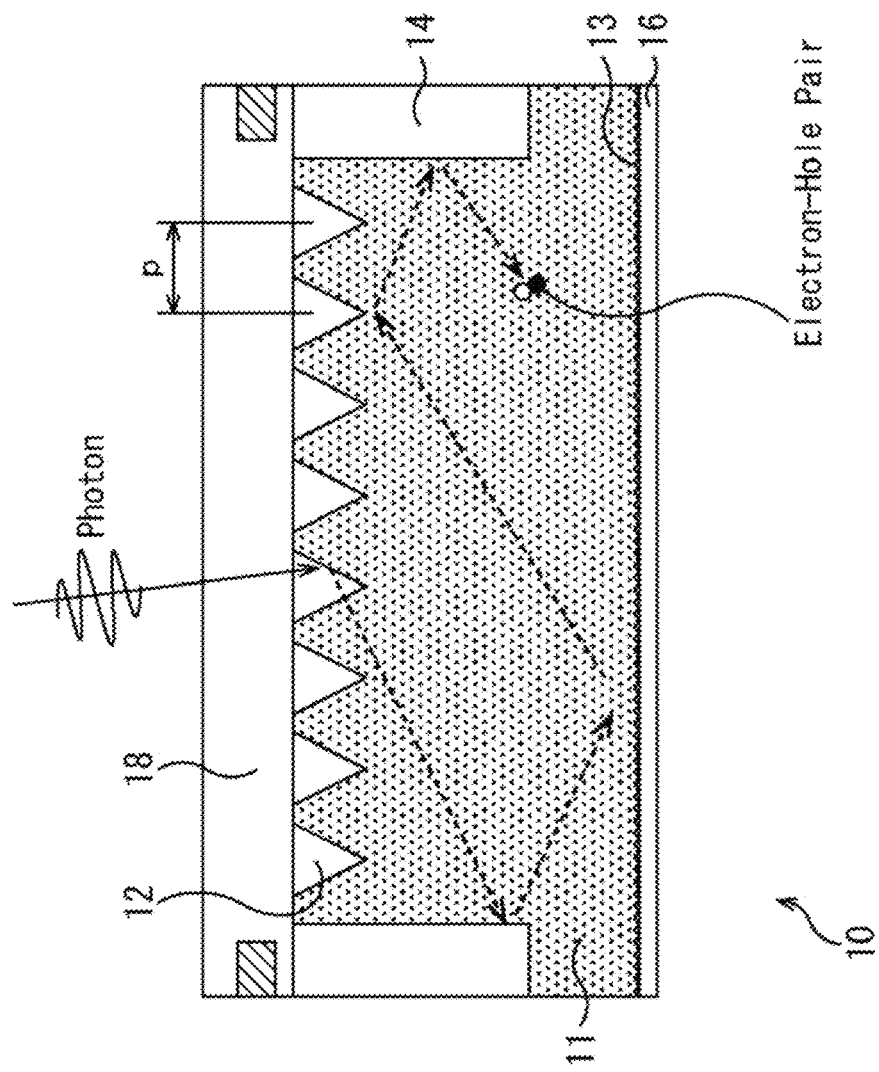
FIG. 6 is a cross-sectional view showing Modification Example 5 of the solid state imaging element to which the present disclosure is applied.

FIG. 6 is a cross-sectional view showing yet another example (Modification Example 5) of the configuration of the solid state imaging element 10 that is an embodiment of the present disclosure. Components in common with the configuration example shown in FIG. 1 are marked with the same reference numerals, and a description thereof is omitted as appropriate.

In Modification Example 5 shown in FIG. 6, the period of the concave-convex pattern 13 in the configuration example shown in FIG. 1 is altered to an infinitely small period, and the metal reflecting wall 15 and the reflecting mirror structure 17 are omitted.

In the case of Modification Example 5, the concave-convex patterns 12 and 13 are formed on the light receiving surface and the opposite surface to the light receiving surface of the Si layer 11, respectively. Further, the element isolation structure 14 is provided at the boundary with an adjacent pixel. Thereby, incident light is likely to repeat reflection in the Si layer 11, and the transmission of light from the Si layer 11 is suppressed; therefore, the light absorption efficiency in the Si layer 11 can be improved. That is, the sensitivity to incident light can be increased.

Modification Example 6 of the Solid State Imaging Element

Figure 7:
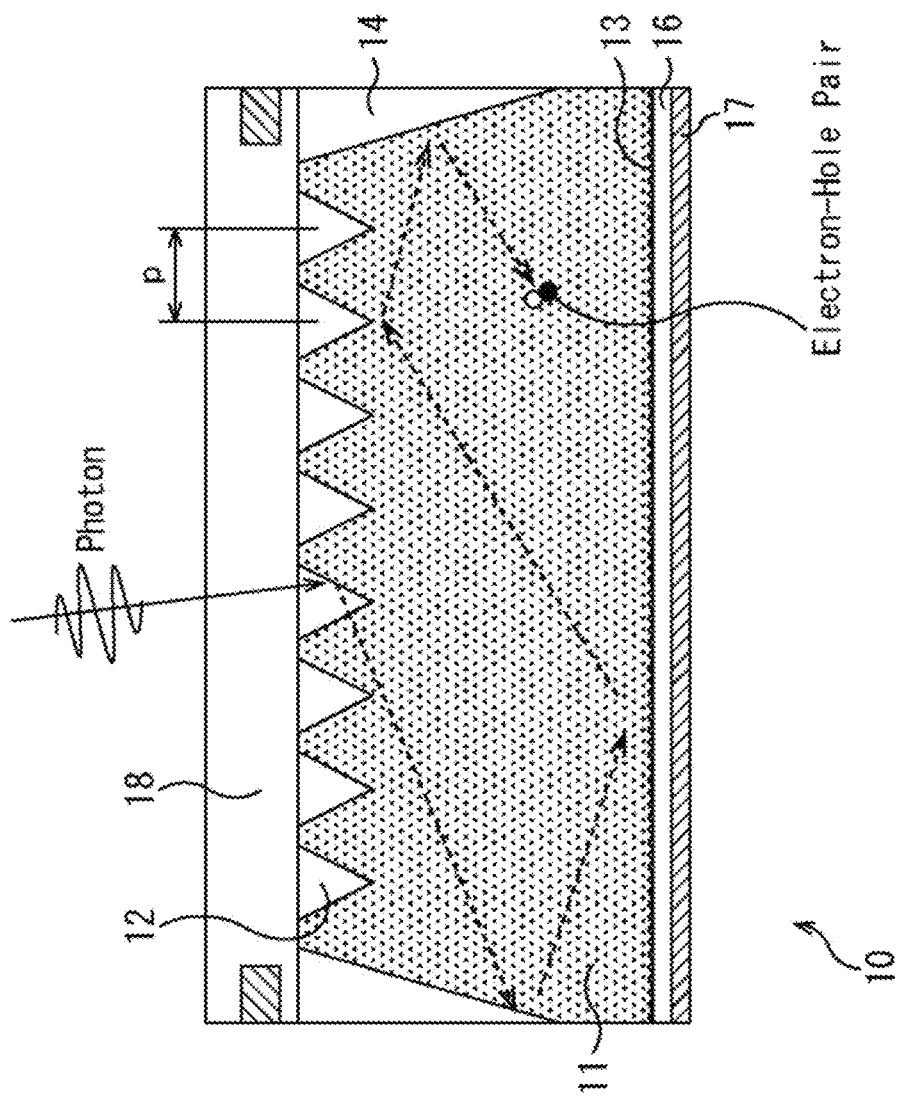
FIG. 7 is a cross-sectional view showing Modification Example 6 of the solid state imaging element to which the present disclosure is applied.

FIG. 7 is a cross-sectional view showing yet another example (Modification Example 6) of the configuration of the solid state imaging element 10 that is an embodiment of the present disclosure. Components in common with the configuration example shown in FIG. 1 are marked with the same reference numerals, and a description thereof is omitted as appropriate.

In Modification Example 6 shown in FIG. 7, the period of the concave-convex pattern 13 in the configuration example shown in FIG. 1 is altered to an infinitely small period, and the metal reflecting wall 15 is omitted. Further, the shape of the element isolation structure 14 is altered. Specifically, the shape of the element isolation structure 14 is altered to a wedge shape in which the area is reduced gradually from the light receiving surface side toward the opposite side to the light receiving surface. By forming the element isolation structure 14 in a wedge shape, the ratio of the reflected light in the lateral direction in the Si layer 11 can be further enhanced as compared to a case like the configuration example of FIG. 1 in which the shape of the element isolation structure 14 is a prism.

In the case of Modification Example 6, the concave-convex patterns 12 and 13 are formed on the light receiving surface and the opposite surface to the light receiving surface of the Si layer 11, respectively. Further, the element isolation structure 14 in a wedge shape is provided at the boundary with an adjacent pixel. Thereby, incident light is likely to repeat reflection in the Si layer 11, and the transmission of light from the Si layer 11 is suppressed; therefore, the light absorption efficiency in the Si layer 11 can be improved. That is, the sensitivity to incident light can be increased.

Modification Example 7 of the Solid State Imaging Element

Figure 8:
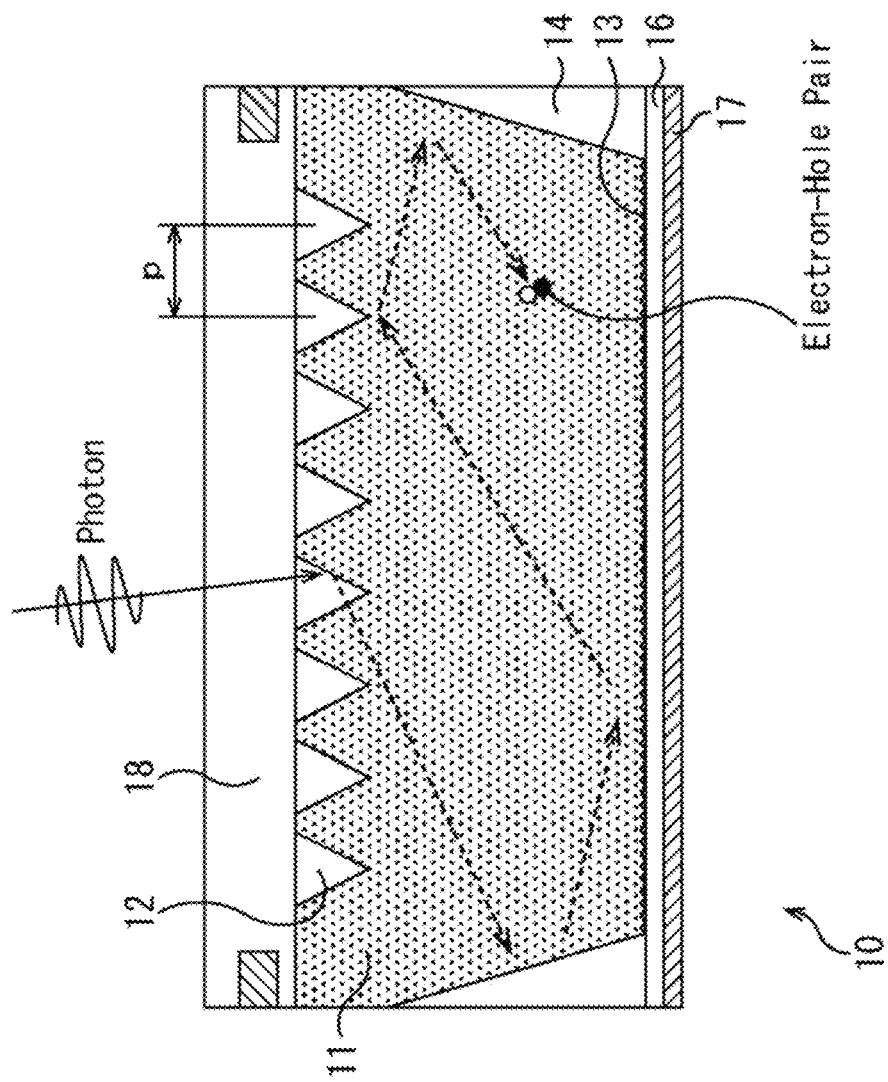
FIG. 8 is a cross-sectional view showing Modification Example 7 of the solid state imaging element to which the present disclosure is applied.

FIG. 8 is a cross-sectional view showing yet another example (Modification Example 7) of the configuration of the solid state imaging element 10 that is an embodiment of the present disclosure. Components in common with the configuration example shown in FIG. 1 are marked with the same reference numerals, and a description thereof is omitted as appropriate.

In Modification Example 7 shown in FIG. 8, the period of the concave-convex pattern 13 in the configuration example shown in FIG. 1 is altered to an infinitely small period, and the metal reflecting wall 15 is omitted. Further, the shape of the element isolation structure 14 is altered to a wedge shape in which the area is reduced gradually from the opposite side to the light receiving surface toward the light receiving surface side. By forming the element isolation structure 14 in a wedge shape, the ratio of the reflected light in the lateral direction in the Si layer 11 can be further enhanced as compared to a case like the configuration example of FIG. 1 in which the shape of the element isolation structure 14 is a prism.

In the case of Modification Example 7, the concave-convex patterns 12 and 13 are formed on the light receiving surface and the opposite surface to the light receiving surface of the Si layer 11, respectively. Further, the element isolation structure 14 in a wedge shape is provided at the boundary with an adjacent pixel. Thereby, incident light is likely to repeat reflection in the Si layer 11, and the transmission of light from the Si layer 11 is suppressed; therefore, the light absorption efficiency in the Si layer 11 can be improved. That is, the sensitivity to incident light can be increased.

Modification Example 8 of the Solid State Imaging Element

Figure 9:
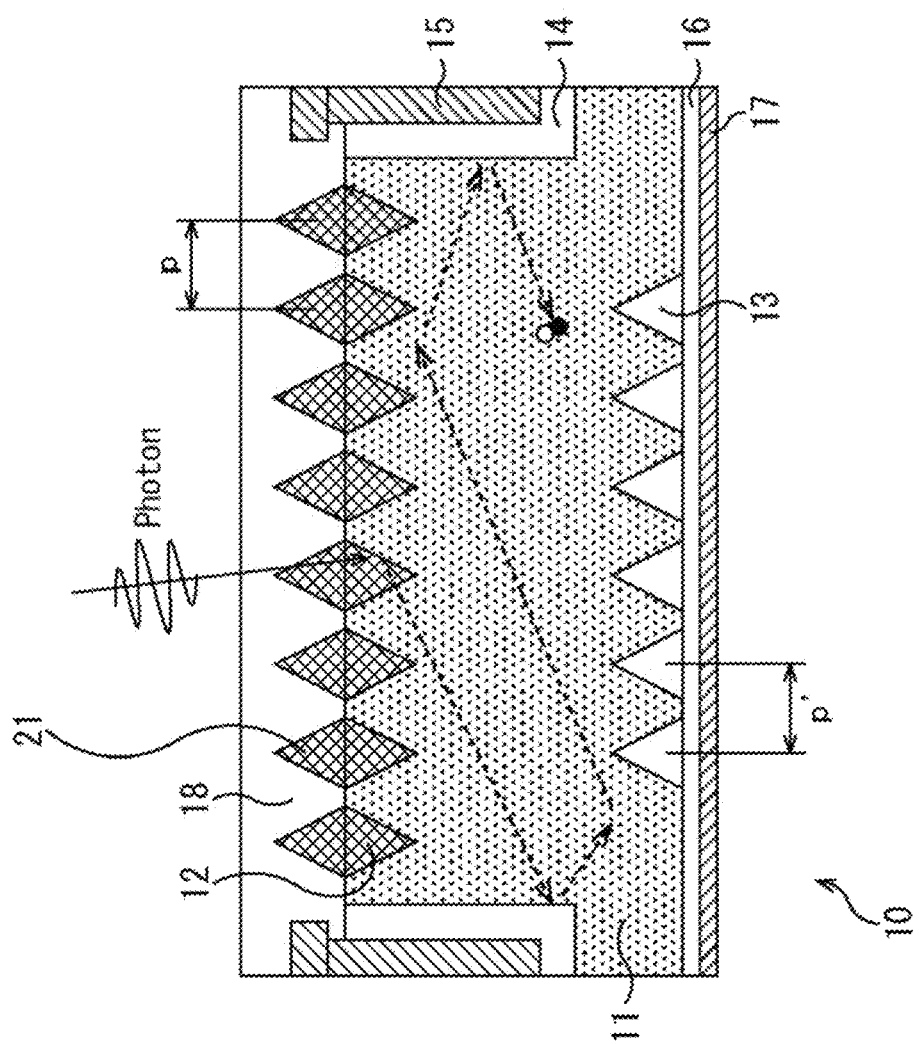
FIG. 9 is a cross-sectional view showing Modification Example 8 of the solid state imaging element to which the present disclosure is applied.

FIG. 9 is a cross-sectional view showing yet another example (Modification Example 8) of the configuration of the solid state imaging element 10 that is an embodiment of the present disclosure. Components in common with the configuration example shown in FIG. 1 are marked with the same reference numerals, and a description thereof is omitted as appropriate.

In Modification Example 8 shown in FIG. 9, as compared to the configuration example shown in FIG. 1, a moth-eye structure 21 that has an inverted configuration to the configuration of the concave-convex pattern 12 and in which the refractive index changes step-by-step from the incidence side as a visual point is added to the upper side of the concave-convex pattern 12 formed on the Si layer 11.

In the case of Modification Example 8, the moth-eye structure 21 and the concave-convex pattern 12 are formed on the light receiving surface of the Si layer 11, and the concave-convex pattern 13 is formed on the opposite surface to the light receiving surface. Further, the element isolation structure 14 is formed at the boundary with an adjacent pixel, and the reflecting mirror structure 17 is formed on the lower side of the Si layer 11. Thereby, incident light is likely to repeat reflection in the Si layer 11, and the transmission of light from the Si layer 11 is suppressed; therefore, the light absorption efficiency in the Si layer 11 can be improved. That is, the sensitivity to incident light can be increased. Furthermore, color mixing derived from an adjacent pixel is suppressed by the element isolation structure 14 and the metal reflecting wall 15.

Modification Example 9 of the Solid State Imaging Element

Figure 10:
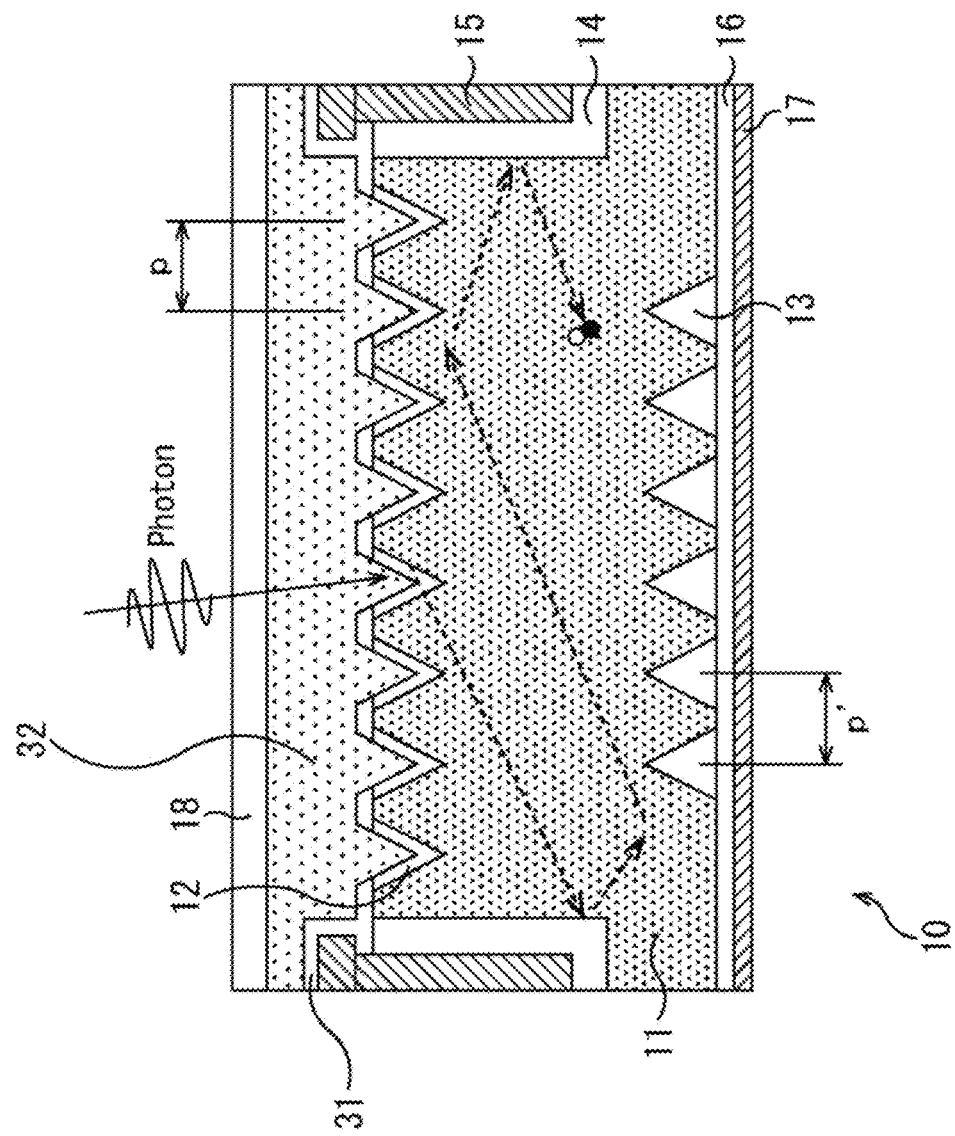
FIG. 10 is a cross-sectional view showing Modification Example 9 of the solid state imaging element to which the present disclosure is applied.

FIG. 10 is a cross-sectional view showing yet another example (Modification Example 9) of the configuration of the solid state imaging element 10 that is an embodiment of the present disclosure. Components in common with the configuration example shown in FIG. 1 are marked with the same reference numerals, and a description thereof is omitted as appropriate.

In Modification Example 9 shown in FIG. 10, as compared to the configuration example shown in FIG. 1, an intermediate film 31 having a refractive index intermediate between the refractive indices of the flattening film 18 and the Si layer 11 is provided on the upper side of the concave-convex pattern 12 formed on the Si layer 11. As the material of the intermediate film 31, a hafnium oxide film, an aluminum oxide, a silicon nitride film, or the like is used. It is preferable that the intermediate film 31 be much thinner than the depth of the concavity and have a similar configuration to the concave-convex pattern 12. A color filter 32 is added to the upper side of the intermediate film 31.

In the case of Modification Example 9, the concave-convex patterns 12 and 13 are formed on the light receiving surface and the opposite surface to the light receiving surface of the Si layer 11, respectively. Further, the element isolation structure 14 is formed at the boundary with an adjacent pixel, and the reflecting mirror structure 17 is formed on the lower side of the Si layer 11. Thereby, incident light is likely to repeat reflection in the Si layer 11, and the transmission of light from the Si layer 11 is suppressed; therefore, the light absorption efficiency in the Si layer 11 can be improved. That is, the sensitivity to incident light can be increased. Furthermore, color mixing derived from an adjacent pixel is suppressed by the element isolation structure 14 and the metal reflecting wall 15. Moreover, since the color filter is formed integrally, the thickness of the solid state imaging element 10 can be reduced as compared to the case where a color filter is placed separately.

The example of the configuration of the solid state imaging element 10 and Modification Examples 2 to 9 thereof described above may be combined as appropriate.

<Examples of the Structure of the Concave-Convex Patterns 12 and 13>

Next, the structure of the concave-convex patterns 12 and 13 formed on the light receiving surface and the opposite surface to the light receiving surface of the Si layer 11, respectively, is described.

Figure 11:
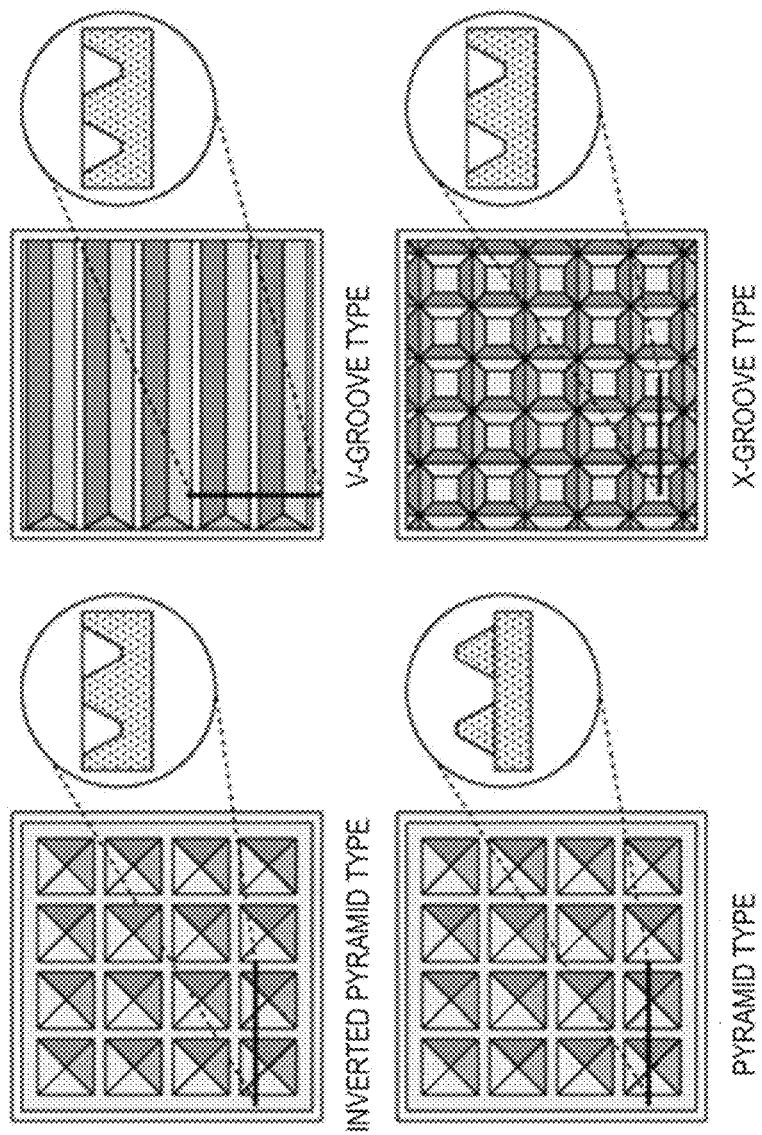
FIG. 11 is a diagram showing examples of the structure of the concave-convex pattern.

FIG. 11 illustrates four examples of an inverted pyramid type, a normal pyramid type, a V-groove type, and an X-groove type as the structure of the concave-convex patterns 12 and 13, and shows a top view and a cross-sectional view of them.

The inverted pyramid type is a configuration in which a concave structure of a quadrangular pyramid shape is formed periodically on the surface of the Si layer 11 (the light receiving surface and the opposite surface to the light receiving surface). The normal pyramid type is a configuration in which a convex structure of a quadrangular pyramid shape is formed periodically on the surface of the Si layer 11.

The V-groove type is a configuration in which straight-lined groove structures aligned parallel to the surface of the Si layer 11 are formed periodically. The X-groove type is a configuration in which straight-lined first groove structures aligned parallel to the surface of the Si layer 11 and straight-lined second groove structures aligned parallel to a direction orthogonal to the first trench structure are formed periodically.

The structure of the concave-convex pattern 12 and the structure of the concave-convex pattern 13 may be of the same type, or may be of different types. The structure of the concave-convex patterns 12 and 13 is not limited to the types of the four examples described above, and may be a configuration in which an identical structure is formed periodically.

<Examples of the Pixels in which the Concave-Convex Patterns 12 and 13 are Used>

As described above, the solid state imaging element 10 of the embodiment is configured such that N×M (N<X, M<Y; e.g. 2×2) adjacent pixels constitute one unit, and each pixel of one unit detects light of the wavelength of any of R, G, B, and IR.

Figure 12:
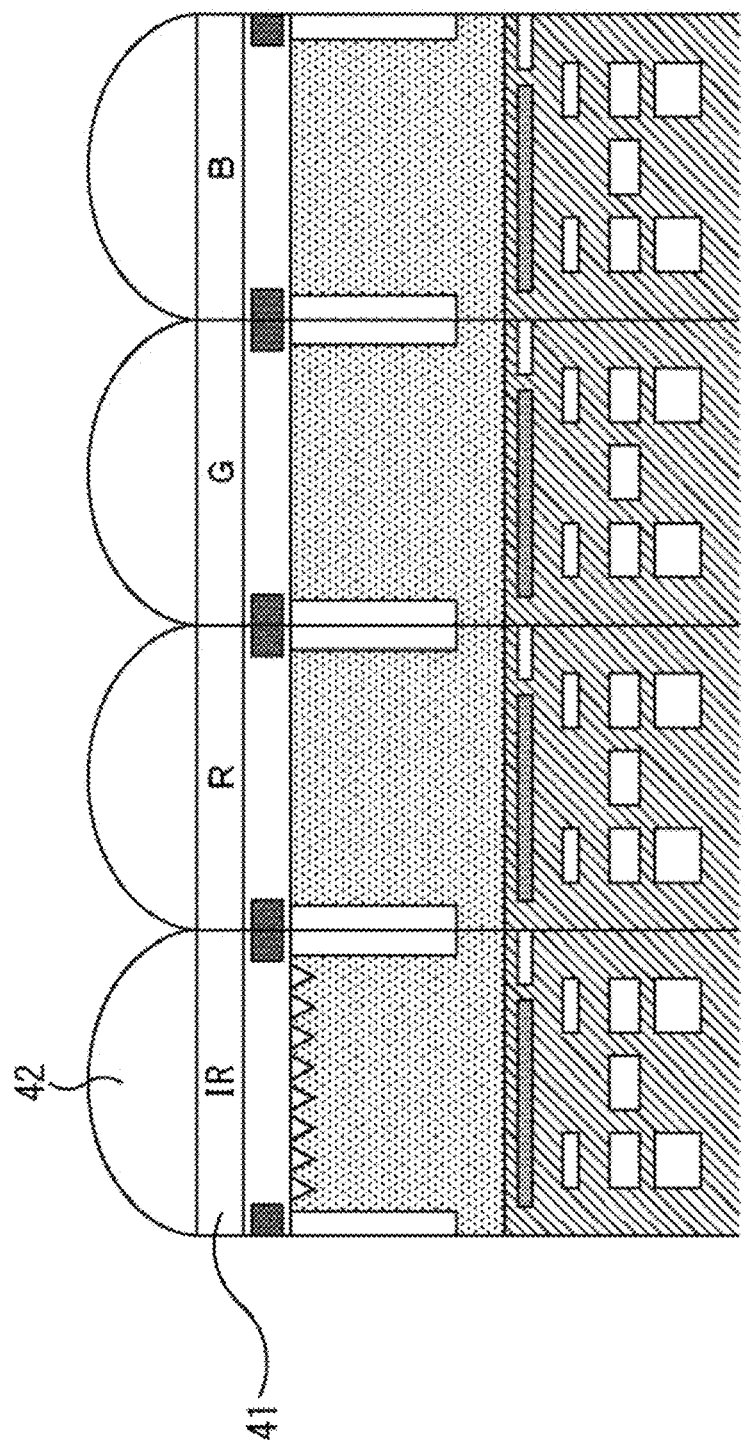
FIG. 12 is a cross-sectional view showing an example of pixels in which a concave-convex pattern is used.

FIG. 12 shows a cross-sectional view of the pixels of one unit in the solid state imaging element 10 of the embodiment. In the case of the drawing, the concave-convex patterns 12 and 13 are used only for the pixel that detects IR on the longest wavelength side, where the light absorption efficiency is relatively low, out of the pixels that detect light of the wavelengths of R, G, B, and IR. In the drawing, the illustration of the concave-convex pattern 13 is omitted.

Figure 13:
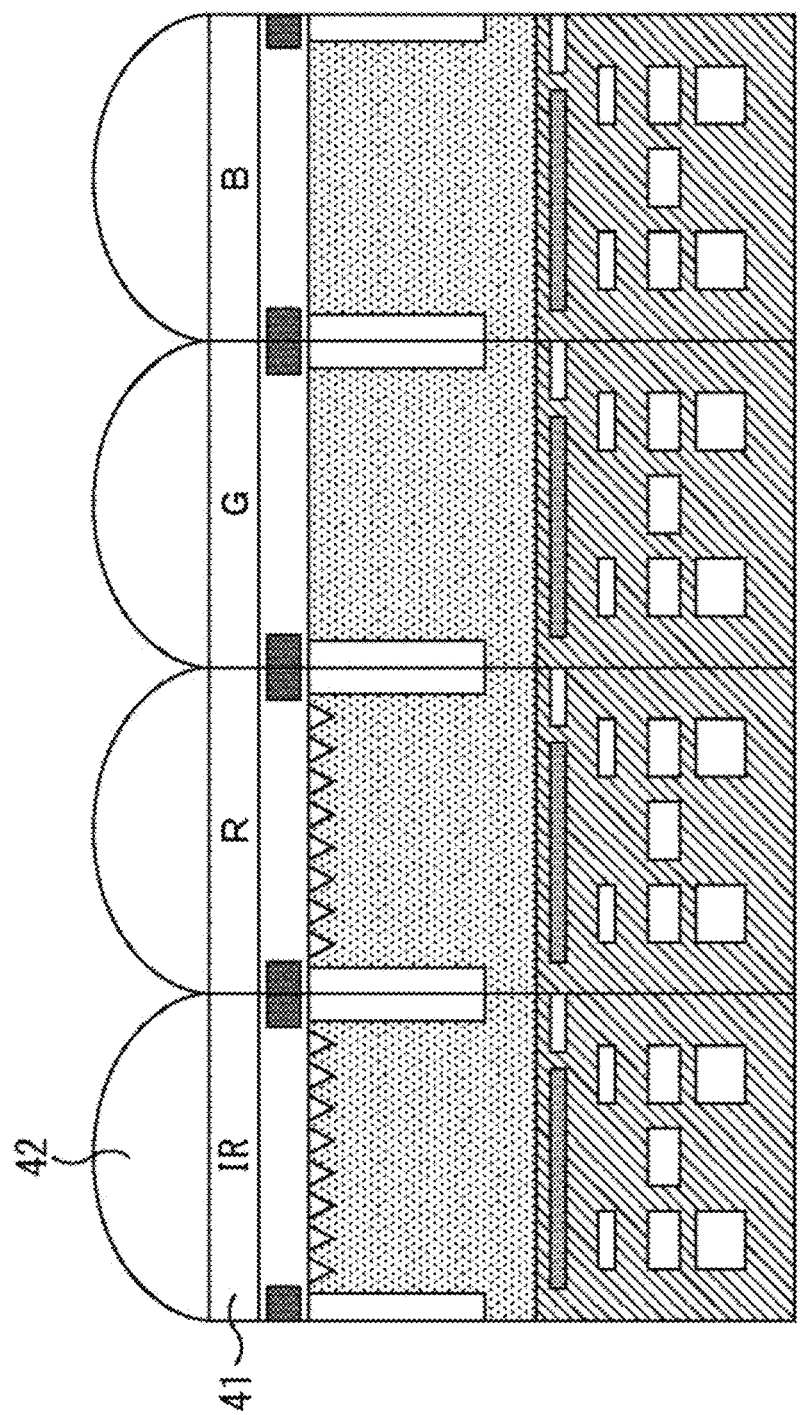
FIG. 13 is a cross-sectional view showing an example of pixels in which a concave-convex pattern is used.

FIG. 13 shows a cross-sectional view of the pixels of one unit in the solid state imaging element 10 of the embodiment. In the case of the drawing, the concave-convex patterns 12 and 13 are used only for the pixels that detect IR and R on the long wavelength side, where the light absorption efficiency is relatively low, out of the pixels that detect light of the wavelengths of R, G, B, and IR. In the drawing, the illustration of the concave-convex pattern 13 is omitted.

Figure 14:
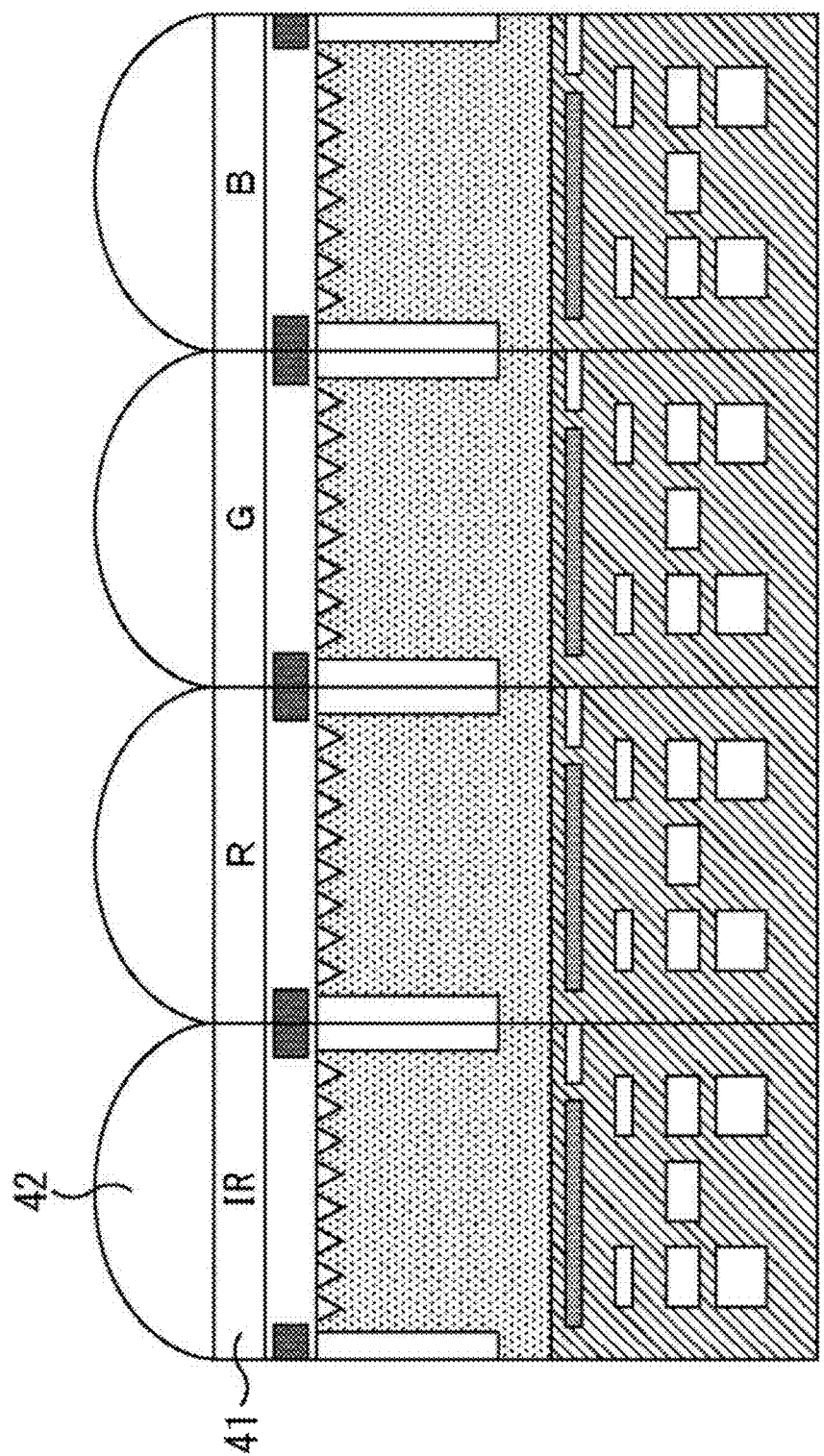
FIG. 14 is a cross-sectional view showing an example of pixels in which a concave-convex pattern is used.

FIG. 14 shows a cross-sectional view of the pixels of one unit in the solid state imaging element 10 of the embodiment. In the case of the drawing, the concave-convex patterns 12 and 13 are used for all the pixels that detect light of the wavelengths of R, G, B, and IR. In the drawing, the illustration of the concave-convex pattern 13 is omitted.

Figure 15:
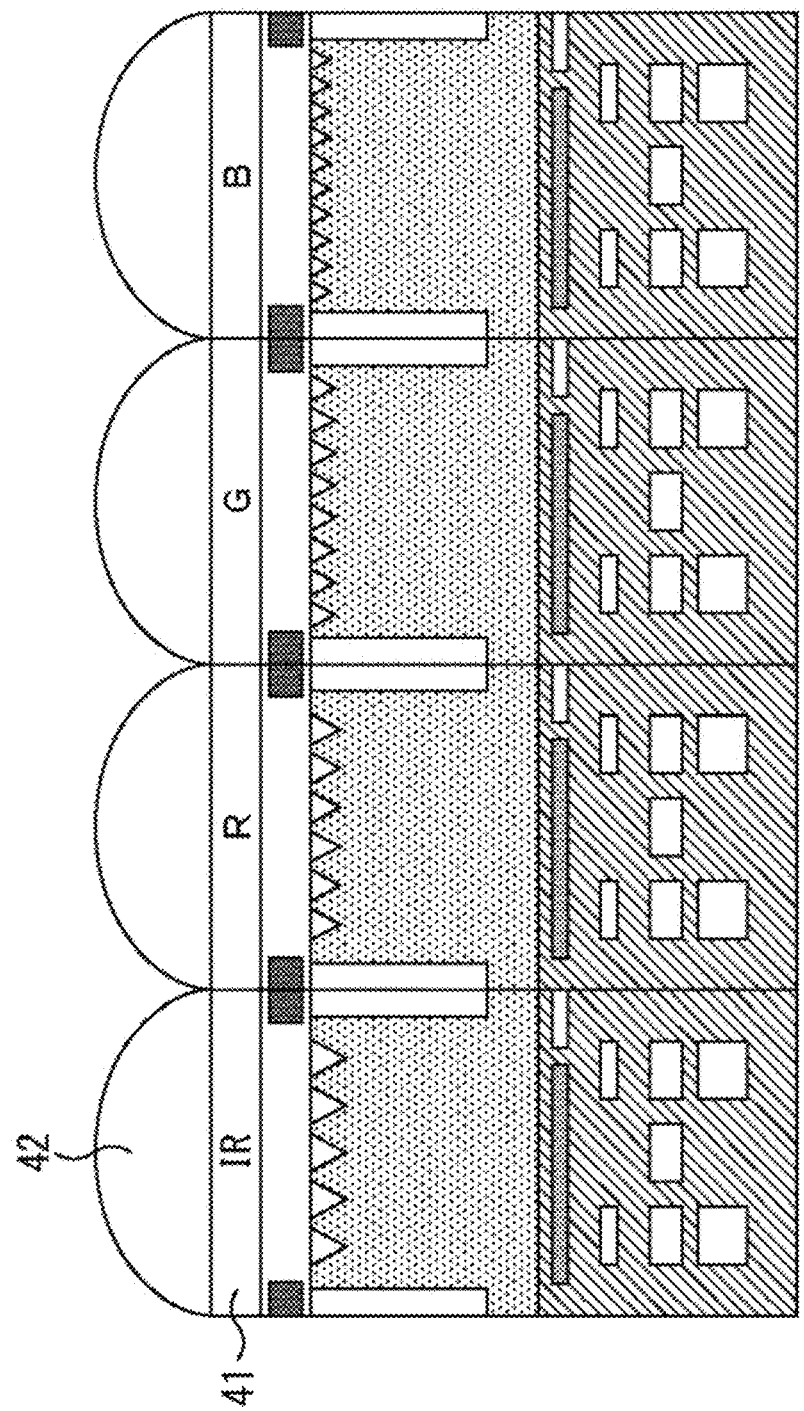
FIG. 15 is a cross-sectional view showing an example of pixels in which a concave-convex pattern is used.

FIG. 15 shows a cross-sectional view of the pixels of one unit in the solid state imaging element 10 of the embodiment. In the case of the drawing, a case where the concave-convex patterns 12 and 13 are used for all the pixels that detect light of the wavelengths of R, G, B, and IR, and the size (period) of the concave-convex patterns 12 and 13 varies in accordance with the wavelength to be detected is shown. That is, the concave-convex patterns 12 and 13 are formed such that the period becomes shorter from the long wavelength side, where the light absorption efficiency is relatively low, toward the short wavelength side, where it is relatively high. In other words, the period of the concave-convex patterns 12 and 13 of the pixel for IR is longest, and the period of the concave-convex patterns 12 and 13 of the pixel for B is shortest. In the drawing, the illustration of the concave-convex pattern 13 is omitted.

Figure 16:
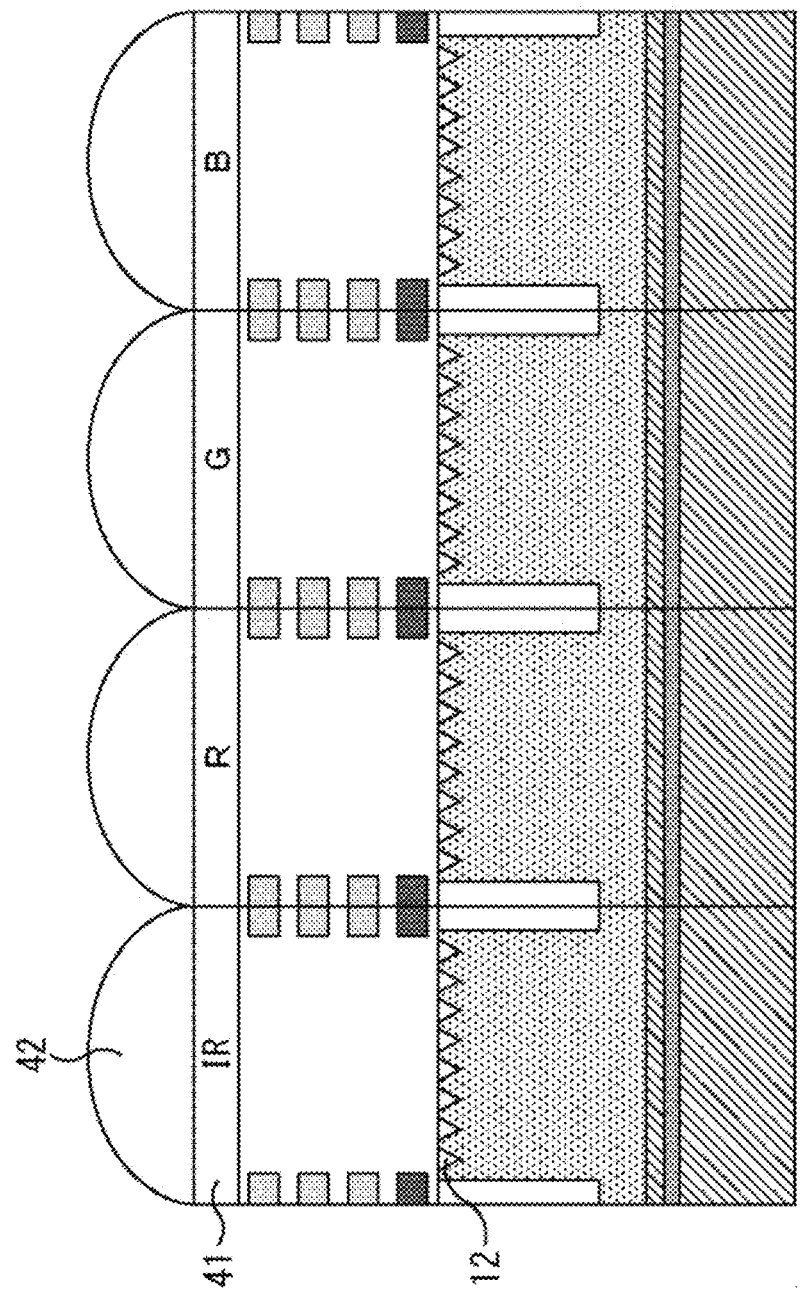
FIG. 16 is a cross-sectional view showing an example of pixels in which a concave-convex pattern is used.

Next, FIG. 16 shows a cross-sectional view of the pixels of one unit in the case where the solid state imaging element 10 of the embodiment is used for a front-side illumination solid state imaging element in which various pixel interconnections etc. are provided on the light incidence surface side. In the case of the drawing, the concave-convex patterns 12 and 13 are used for all the pixels that detect light of the wavelengths of R, G, B, and IR. In the drawing, the illustration of the concave-convex pattern 13 is omitted. In the case where a mirror structure is placed on the back surface side of the light absorbing layer in the front-side illumination solid state imaging element 10 shown in the drawing, the mirror structure can be placed between pixels without a gap because the interconnection etc. are not present on the back surface side.

Although the concave-convex patterns 12 and 13 may not necessarily be formed in all the pixels of R, G, B, and IR as shown in FIG. 12 to FIG. 16, the concave-convex patterns 12 and 13 are formed at least in the pixel of IR.

<Simulation of the Light Absorption Efficiency>

Next, the light absorption efficiency in the Si layer 11 of the solid state imaging element 10 of the embodiment is described.

Figure 17:
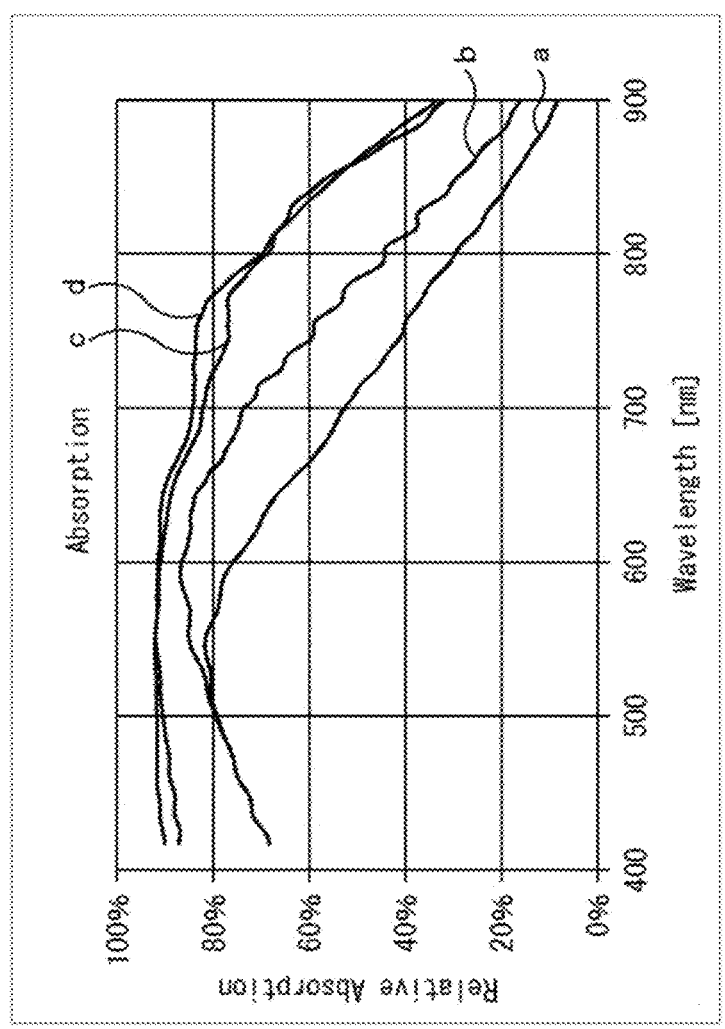
FIG. 17 is a diagram showing the results of simulation of the light absorption efficiency.

FIG. 17 shows the results of simulation of the change in the light absorption efficiency of the Si layer with respect to the wavelength of incident light. In the drawing, the horizontal axis represents the wavelength of incident light, and the vertical axis represents the light absorption efficiency in the Si layer. The thickness of the Si layer is assumed to be 3 um.

In the drawing, curved line a shows the result of simulation for the characteristics of a conventional solid state imaging element in which a concave-convex pattern is not formed on either surface of the Si layer (neither the light receiving surface nor the opposite surface to the light receiving surface). Curved line b shows the result of simulation for the characteristics of a solid state imaging element in which a concave-convex pattern is not formed on either surface of the Si layer and a reflecting mirror structure is provided on the lower side of the Si layer. Curved lines c and d show the results of simulation for the characteristics of the solid state imaging element 10 of the embodiment, that is, a solid state imaging element in which the concave-convex patterns 12 and 13 are formed on both surfaces of the Si layer 11 and the reflecting mirror structure 17 is provided.

The characteristics shown by curved line a are that the light absorption efficiency is lower in the entire wavelength range than those of the other curved lines, and this tendency is significant particularly on the long wavelength side. The characteristics shown by curved line b are that an improvement in light absorption efficiency of approximately 10% to 20% over curved line a is seen in the range of wavelengths of 650 nm to 900 nm. In curved lines c and d, an improvement in light absorption efficiency over the characteristics of curved lines a and b is seen in the entire wavelength range, and a significant improvement in light absorption efficiency is seen particularly in the range of wavelengths of 700 nm to 900 nm corresponding to red light to infrared light. Therefore, it can be said that the solid state imaging element 10 of the embodiment has the effect of improving the light absorption efficiency of the Si layer 11 in the case of sensing the wavelength of each of R, G, B, and IR, and has the effect of greatly improving the light absorption efficiency of the Si layer 11 particularly in the case of sensing R or IR on the relatively long wavelength side.

<Restrictions on the Size of the Concave-Convex Pattern 12>

Figure 18:
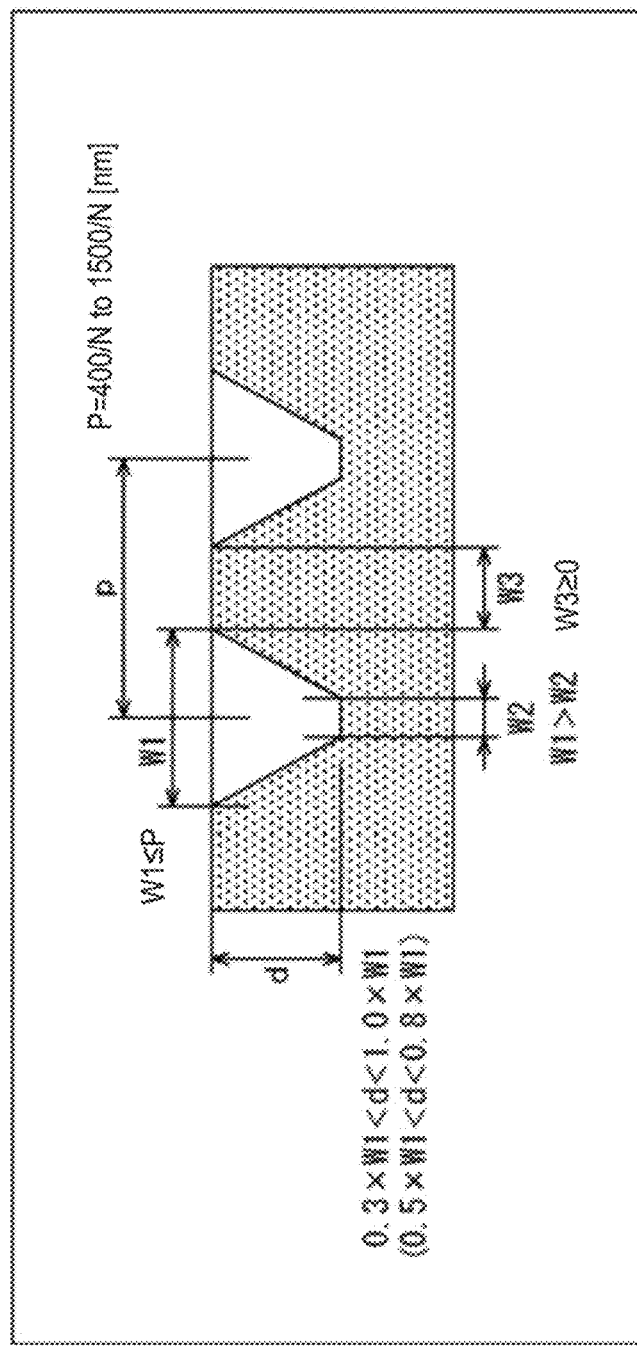
FIG. 18 is a diagram describing the restrictions on the size of the concave-convex pattern.

Next, the restrictions on the size of the concave-convex pattern 12 is described. FIG. 18 shows the relationships of the size and the period P of the concave-convex pattern 12.

The period P of the concave-convex pattern 12 is preferably 400/N to 1500/N [nm]. N is the refractive index of the medium of the surroundings of the concave-convex pattern 12. When N=1.5, the period P is 1000 nm=1 um or less. The width W1 of the top of the opening of the concave-convex pattern 12 is set to the period P or less. The width W2 of the bottom of the opening of the concave-convex pattern 12 is set narrower than the width W1 of the top of the opening of the concave-convex pattern 12. The spacing W3 between adjacent concavities of the concave-convex pattern 12 is set to 0 or more. The depth d of the concave-convex pattern 12 is set narrower than the width W1 of the top of the opening. Specifically, $0.3 \cdot W1 < d < 1.0 \cdot W1$, or $0.5 \cdot W1 < d < 0.8 \cdot W1$ is satisfied.

There are also similar restrictions on the size of the concave-convex pattern 13.

<Process of the Formation of the Concave-Convex Patterns 12 and 13>

Figure 19:
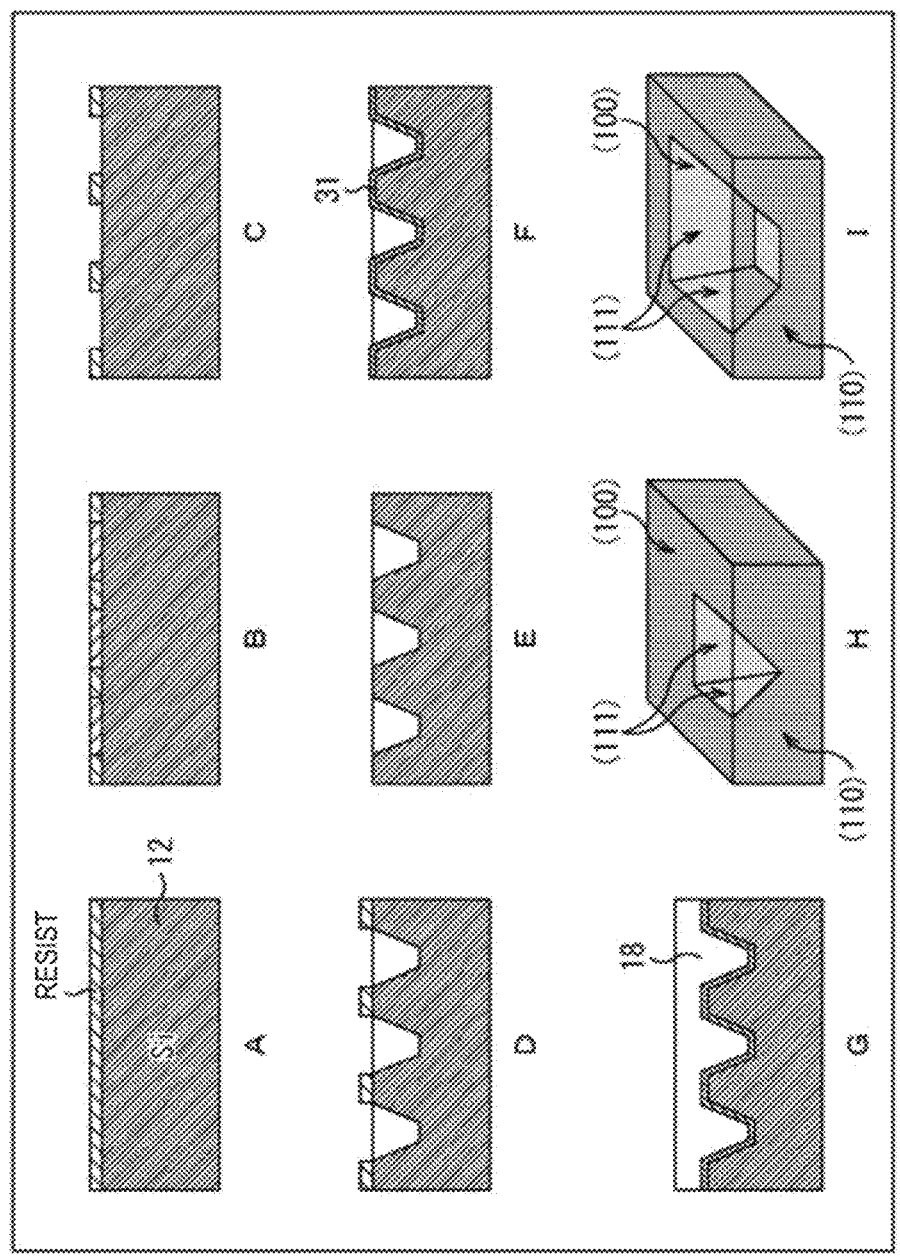
FIG. 19 is a diagram describing the process of the formation of the concave-convex pattern.

Next, the process of the formation of the concave-convex patterns 12 and 13 is described. FIG. 19 shows an example of the process of the formation of the concave-convex patterns 12 and 13.

First, as shown in A of the drawing, a resist is applied to the surface of the Si layer 11; and next, as shown in B of the drawing, exposure is performed by EUV exposure, electron beam lithography, or the like on the places where the concavities of the concave-convex pattern are to be formed; thus, marking is performed.

Next, as shown in C of the drawing, the marking places of the applied resist are removed; as shown in D of the drawing, crystalline anisotropic etching is performed by wet etching or dry etching to form concavities; and as shown in E of the drawing, the resist is removed.

Further, as shown in F of the drawing, the intermediate film 31 having a refractive index intermediate between the refractive indices of the flattening film 18 and the Si layer 11 is formed as a film on the surface of the Si layer 11 including the anisotropically etched concavities. As the material of the intermediate film 31, a high dielectric material such as a hafnium oxide film, an aluminum oxide, or a silicon nitride film may be used. It is preferable that the intermediate film 31 be much thinner than the depth of the concavity and have a similar configuration to the concave-convex pattern. Finally, as shown in G of the drawing, the flattening film 18 made of a dielectric material is formed as a film on the upper side of the intermediate film 31. As the material of the flattening film, $SiO_2$, SiN, or the like is used.

When forming the concavity of the concave-convex pattern, as shown in H and I of the drawing, the light receiving surface and the opposite surface to the light receiving surface of the Si layer 11 may be set to the (100) crystal plane, and the wall surface of the concavity may be set to the (111) crystal plane; thereby, a high-accuracy concave-convex pattern can be formed while crystal defects are suppressed by crystalline anisotropic etching.

<Conclusions>

By the solid state imaging element 10 of the embodiment described above, the light receiving sensitivity in the wavelength ranges of R, G, B, and IR can be improved, and particularly the light receiving sensitivity in the IR wavelength range can be improved greatly, without increasing the thickness of the Si layer 11.

The solid state imaging element 10 that is an embodiment of the present disclosure can be used for either a back-side illumination type or a front-side illumination type.

The solid state imaging element 10 of the embodiment can be used for any type of electronic device having an imaging function or a sensing function using a solid state imaging element, including imaging devices typified by digital video cameras and digital still cameras.

<Example of the Configuration of the Electronic Device>

Figure 20:
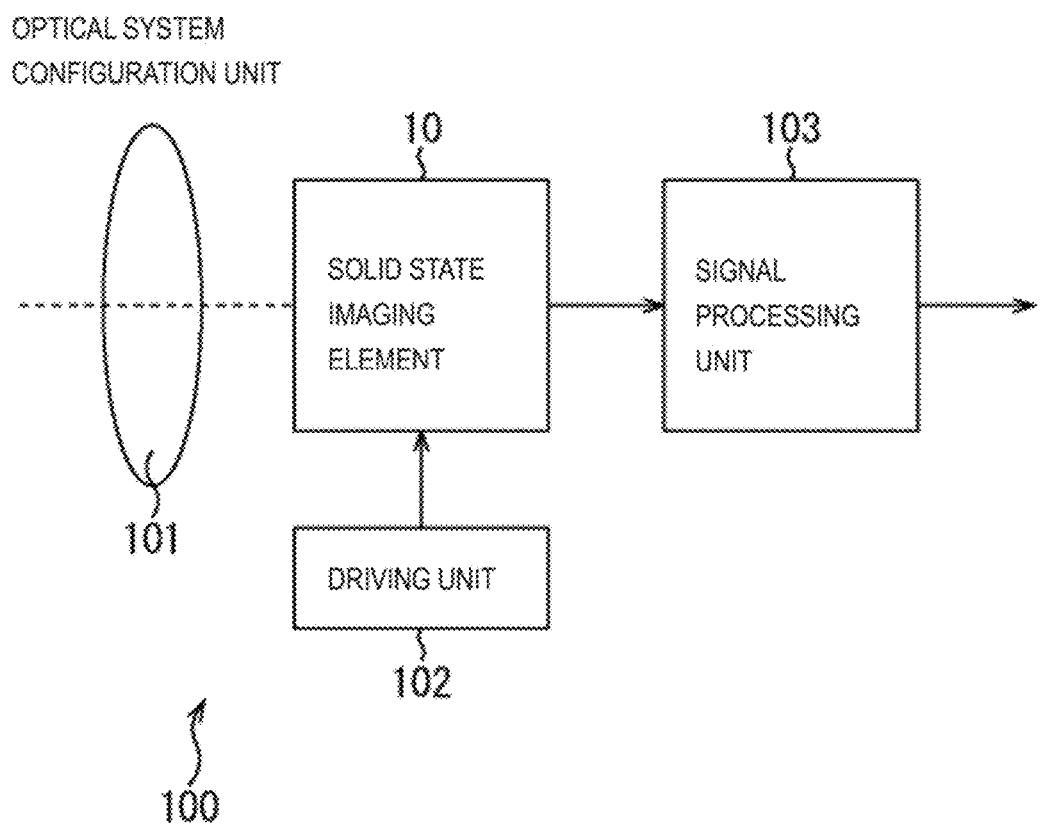
FIG. 20 is a block diagram showing an example of the configuration of an electronic device to which the present disclosure is applied.

FIG. 20 shows an example of the configuration of an electronic device for which the solid state imaging element 10 of the embodiment is used.

An electronic device 100 illustrated has an imaging function using the solid state imaging element 10 described above. The electronic device 100 includes the solid state imaging element 10, an optical system configuration unit 101, a driving unit 102, and a signal processing unit 103.

The optical system configuration unit 101 is formed of an optical lens etc., and causes an optical image of a subject to be incident on the solid state imaging element 10. The driving unit 102 generates and outputs various timing signals related to the driving of the inside of the solid state imaging element 10, and thereby controls the driving of the solid state imaging element 10. The signal processing unit 103 performs a prescribed signal processing on an image signal outputted from the solid state imaging element 10, and executes processing in accordance with the result of the signal processing. Further, the signal processing unit 103 outputs an image signal of the result of the signal processing to a later stage, and records the image signal on a recording medium such as a solid state memory or transfers the image signal to a certain server via a certain network, for example.

The embodiment of the present disclosure is not limited to the embodiments described above, and various alterations are possible without departing from the spirit of the present disclosure.

Additionally, the present technology may also be configured as below.

(1)

A solid state imaging element in which a large number of pixels are arranged vertically and horizontally, the solid state imaging element including:

a periodic concave-convex pattern on a light receiving surface and an opposite surface to the light receiving surface of a light absorbing layer as a light detecting element.

(2)

The solid state imaging element according to (1), wherein the light absorbing layer is made of single-crystal Si.

(3)

The solid state imaging element according to (1) or (2), wherein the concave-convex pattern is formed at least on the light receiving surface and the opposite surface to the light receiving surface of the light absorbing layer corresponding to a pixel for IR detection out of the large number of pixels.

(4)

The solid state imaging element according to any one of (1) to (3), wherein a period of the concave-convex pattern formed on the opposite surface to the light receiving surface of the light absorbing layer is infinitely small.

(5)

The solid state imaging element according to any one of (1) to (4), wherein a period of the concave-convex pattern formed on the light receiving surface and the opposite surface to the light receiving surface of the light absorbing layer varies in accordance with a wavelength to be sensed.

(6)

The solid state imaging element according to any one of (1) to (5), wherein the concave-convex pattern is formed one-dimensionally periodically or two-dimensionally periodically.

(7)

The solid state imaging element according to any one of (1) to (6), wherein a crystal plane of the light receiving surface and the opposite surface to the light receiving surface of the light absorbing layer on which the concave-convex pattern is formed is a (100) plane, and a crystal plane of a wall surface of the concave-convex pattern is a (111) plane.

(8)

The solid state imaging element according to any one of (1) to (7), wherein a period of the concave-convex pattern is 1 um or less.

(9)

The solid state imaging element according to any one of (1) to (8), wherein an element isolation structure is formed at a boundary with an adjacent pixel of the light absorbing layer.

(10)

The solid state imaging element according to (9), wherein the element isolation structure is made of a material having a refractive index lower than a refractive index of the light absorbing layer.

(11)

The solid state imaging element according to (9) or (10), wherein a metal reflecting wall is formed in the element isolation structure.

(12)

The solid state imaging element according to any one of (1) to (11), further including a reflecting mirror structure on a lower side of the light absorbing layer.

(13)

The solid state imaging element according to (12), wherein an interconnection layer serves also as the reflecting mirror structure.

(14)

An electronic device equipped with a solid state imaging element in which a large number of pixels are arranged vertically and horizontally, wherein the solid state imaging element has a periodic concave-convex pattern on a light receiving surface and an opposite surface to the light receiving surface of a light absorbing layer as a light detecting element.

REFERENCE SIGNS LIST

10 solid state imaging element
11 Si layer
12, 13 concave-convex pattern
14 element isolation structure
15 metal reflecting wall
16 insulating film
17 reflecting mirror structure
18 flattening film
31 intermediate film
32 color filter

The invention claimed is:

1. A solid state imaging element, comprising:
a light detecting element disposed in a silicon layer;
a first concave-convex pattern on a first surface of the silicon layer, the first surface being a light receiving surface;
an interconnection layer disposed below the silicon layer; and
a reflecting mirror structure on a lower side of the light detecting element,
wherein the silicon layer is made of single-crystal Si,
wherein the interconnection layer is planar,
wherein the light detecting element is disposed between a first isolation structure and a second isolation structure, and
wherein the first concave-convex pattern has an inverted pyramid shape.

2. The solid state imaging element according to claim 1, wherein the light detecting element detects infra-red (IR) light.

3. The solid state imaging element according to claim 1, further comprising:
a second concave-convex pattern on a second surface of the silicon layer that is opposite the first surface.

4. The solid state imaging element according to claim 3, wherein a period of the first concave-convex pattern on the first surface and a period of the second concave-convex pattern on the second surface vary based on a wavelength of light that is to be sensed.

5. The solid state imaging element according to claim 3, wherein the first concave-convex pattern and the second periodic concave-convex pattern are one of one-dimensional or two-dimensional.

6. The solid state imaging element according to claim 3, wherein a first crystal plane of the first surface and the second surface is (100), and wherein a second crystal plane of a wall surface of the first concave-convex pattern is (111).

7. The solid state imaging element according to claim 1, wherein a period of the first concave-convex pattern is 1 um or less.

8. The solid state imaging element according to claim 1, wherein the first and second isolation structures are made of a material of a first refractive index lower than a second refractive index of the light detecting element.

9. The solid state imaging element according to claim 1, wherein the first and second isolation structures comprise metal reflecting walls.

10. The solid imaging element according to claim 1, wherein the interconnection layer serves as the reflecting mirror structure.

11. An electronic device, comprising:
a solid state imaging element, wherein the solid state imaging element comprises:
a light detecting element disposed in a silicon layer;
a first concave-convex pattern on a first surface of the silicon layer, the first surface being a light receiving surface;
an interconnection layer disposed below the silicon layer; and
a reflecting mirror structure on a lower side of the light detecting element,
wherein the silicon layer is made of single-crystal Si,
wherein the interconnection layer is planar,
wherein the light detecting element is disposed between a first isolation structure and a second isolation structure, and
wherein the first concave-convex pattern has an inverted pyramid shape.

12. The solid state imaging element according to claim 1, wherein the interconnection layer is disposed from a first region corresponding to a first trench to a second region corresponding to a second trench, wherein the first trench includes the first isolation structure, and wherein the second trench includes the second isolation structure.

13. The solid state imaging element according to claim 1, further comprising:
a second concave-convex pattern on a second surface of the silicon layer that is opposite the first surface, wherein, in a cross sectional view, a width of part of the first concave-convex pattern is different from a width of a part of the second concave-convex pattern.

14. The solid state imaging element according to claim 1, wherein a widest section of the inverted pyramid shape period has a width that is less than or equal to a period of the first concave-convex pattern.

15. The solid state imaging element according to claim 14, wherein a depth of the inverted pyramid shape is less than the width of the widest section.

16. The solid state imaging element according to claim 1, wherein the inverted pyramid shape has a base surface and a tip surface that are parallel to the first surface.

17. The solid state imaging element according to claim 1, wherein a depth of the inverted pyramid shape is between $0.3*W1$ and $1.0*W1$, where W1 is a width of a widest part of an opening that defines the inverted pyramid shape in the concave-convex pattern.

* * * * *